United States Patent
Prather et al.

(10) Patent No.: US 11,698,831 B2
(45) Date of Patent: Jul. 11, 2023

(54) METHODS FOR ERROR COUNT REPORTING WITH SCALED ERROR COUNT INFORMATION, AND MEMORY DEVICES EMPLOYING THE SAME

(71) Applicant: Micron Technology, Inc., Boise, ID (US)

(72) Inventors: Matthew A. Prather, Boise, ID (US); Randall J. Rooney, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/372,453

(22) Filed: Jul. 10, 2021

(65) Prior Publication Data

US 2021/0334159 A1 Oct. 28, 2021

Related U.S. Application Data

(63) Continuation of application No. 16/509,417, filed on Jul. 11, 2019, now Pat. No. 11,074,126.
(Continued)

(51) Int. Cl.
  *G06F 11/00* (2006.01)
  *G06F 11/10* (2006.01)
  (Continued)

(52) U.S. Cl.
  CPC ........ *G06F 11/1068* (2013.01); *G06F 11/076* (2013.01); *G11C 13/0026* (2013.01); *G11C 13/0028* (2013.01); *G06F 2201/88* (2013.01)

(58) Field of Classification Search
  CPC ............... G06F 11/1068; G06F 11/076; G06F 2201/88; G11C 13/0026; G11C 13/0028
  See application file for complete search history.

(56) References Cited

U.S. PATENT DOCUMENTS 9,471,423 B1 * 10/2016 Healy ................. G06F 11/1048
2001/0029592 A1    10/2001 Walker et al.
(Continued)

FOREIGN PATENT DOCUMENTS

KR    20160022250 A    2/2016

OTHER PUBLICATIONS

M. Awasthi, M. Shevgoor, K. Sudan, B. Rajendran, R. Balasubramonian and V. Srinivasan, "Efficient scrub mechanisms for error-prone emerging memories," IEEE International Symposium on High-Performance Comp Architecture, 2012, pp. 1-12, doi: 10.1109/HPCA.2012.6168941. (Year: 2012).*
(Continued)

*Primary Examiner* — Daniel F. McMahon
(74) *Attorney, Agent, or Firm* — Perkins Coie LLP

(57) ABSTRACT

An apparatus comprising a memory array including a plurality of memory cells arranged in a plurality of columns and a plurality of rows is provided. The apparatus further comprises circuitry configured to perform an error detection operation on the memory array to determine a raw count of detected errors, to compare the raw count of detected errors to a threshold value to determine an over-threshold amount, to scale the over-threshold amount according to a scaling algorithm to determine a scaled error count, and to store the scaled error count in a user-accessible storage location.

17 Claims, 4 Drawing Sheets

Related U.S. Application Data

(60) Provisional application No. 62/697,293, filed on Jul. 12, 2018.

(51) Int. Cl.
   *G06F 11/07* (2006.01)
   *G11C 13/00* (2006.01)

(56) References Cited

U.S. PATENT DOCUMENTS

| | | | |
|---|---|---|---|
| 2003/0217323 | A1 | 11/2003 | Guterman et al. |
| 2004/0205433 | A1 | 10/2004 | Gower et al. |
| 2009/0177932 | A1* | 7/2009 | Abts ............... G06F 11/106 714/763 |
| 2010/0332900 | A1* | 12/2010 | Yang ............... G06F 11/1096 711/E12.007 |
| 2013/0007541 | A1* | 1/2013 | Carman ............ G06F 11/106 714/763 |
| 2014/0337688 | A1 | 11/2014 | Billing et al. |
| 2015/0243373 | A1 | 8/2015 | Chun et al. |
| 2015/0318058 | A1 | 11/2015 | Curley et al. |
| 2016/0225436 | A1* | 8/2016 | Wang ............... G06F 11/073 |
| 2016/0350180 | A1 | 12/2016 | Halbert et al. |
| 2017/0060657 | A1 | 3/2017 | Healy et al. |
| 2017/0060681 | A1 | 3/2017 | Halbert et al. |
| 2017/0139641 | A1 | 5/2017 | Cha et al. |
| 2018/0182465 | A1 | 6/2018 | Alhussien et al. |
| 2018/0188954 | A1 | 7/2018 | Chu et al. |
| 2018/0374549 | A1* | 12/2018 | Padilla ............... G11C 16/3431 |
| 2019/0384504 | A1* | 12/2019 | Galbraith ............ G06F 3/0653 |
| 2020/0019462 | A1* | 1/2020 | Prather ............... G11C 13/0028 |

OTHER PUBLICATIONS

N. R. Mielke, R. E. Frickey, I. Kalastirsky, M. Quan, D. Ustinov and V. J. Vasudevan, "Reliability of Solid-State Drives Based on NAND Flash Memory," in Proceedings of the IEEE, vol. 105, No. 9, pp. 1725-1750, Sep. 2017, doi: 10.1109/JPROC.2017.2725738. (Year: 2017).*

Korean Patent Application No. 10-2021-7002613—Korean Office Action and Search, dated Feb. 21, 2022, with English Translation, 10 pages.

International Application No. PCT/US2019/041591—International Search Report and Written Opinion, dated Oct. 31, 2019, 10 pages.

Y. Cai, S. Ghose, E.F. Haratsch, Y. Luo and O. Mutlu. "Error Characterization, Mitigation, and Recovery in Flash-Memory-Based Solid-State Drives," in Proceedings of the IEE, vol. 105, No. 9, pp. 1666-1704, Sep. 2017, doi: 10.1109/JPROC.2017.2713127, 2017.

Korean Patent Application No. 10-2021-7002613, Korean Notice of Allowance, dated Jun. 29, 2022, with English Translation, 4 pages.

EP Patent Application No. 19833676.0—Extended European Search Report, dated Mar. 11, 2022, 8 pages.

* cited by examiner

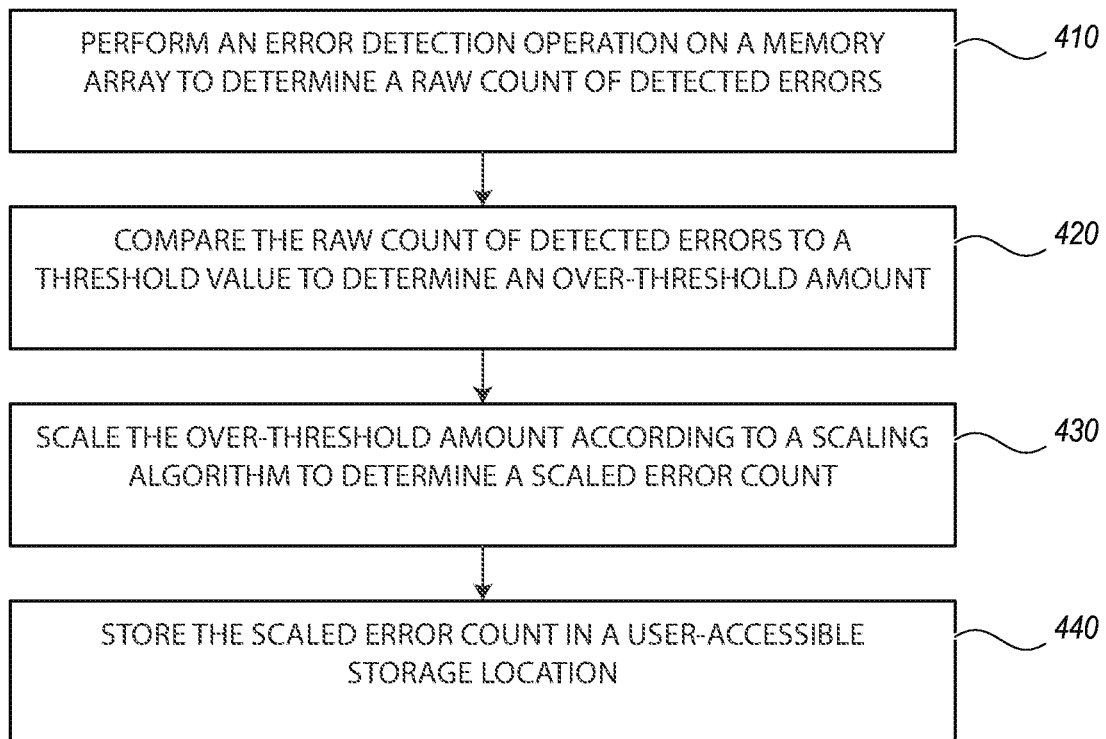

METHODS FOR ERROR COUNT REPORTING WITH SCALED ERROR COUNT INFORMATION, AND MEMORY DEVICES EMPLOYING THE SAME

CROSS-REFERENCE TO RELATED APPLICATIONS

This application is a continuation of U.S. patent application Ser. No. 16/509,417, filed Jul. 11, 2019(U.S. Pat. No. 11,074,126), which claims the benefit of U.S. Provisional Application No. 62/697,293, filed Jul. 12, 2018, each of which are incorporated herein by reference in their entireties.

TECHNICAL FIELD

The present disclosure relates to methods for error count reporting with scaled error count information, and memory devices employing the same.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE FIGURES AND APPENDIX

FIG. 4 is a flow chart illustrating a method of operating a memory device or a system in accordance with an embodiment of the present technology.

DETAILED DESCRIPTION

Memory devices, such as DDR5 DRAM devices, may be configured with error-correcting code (ECC) to perform on-die error detection and/or correction functions. In the process of detecting and correcting errors, metadata regarding device performance (e.g., error counts, error rates, etc.) may be generated. This metadata may provide valuable information about the reliability and/or remaining lifespan of the device, and accordingly may be stored in a user-accessible location for end users to retrieve on demand.

One approach to storing and/or reporting error counts involves reporting error counts only after they exceed a predetermined threshold level. The error count in excess of the threshold can be stored for reporting purposes in, e.g., a mode register of the memory device. Table 1, below, illustrates one such an example:

TABLE 1

| Errors | Count Reported |
|---|---|
| 0-64 | 0 |
| 65 | 1 |
| 66 | 2 |

For a variety of reasons, however, it may not be desirable to store and/or report all of the metadata generated by ECC functions on the device. For example, when the metadata includes a total count of detected errors, the count itself may grow quite large over the life of the device, given that the total size of a memory array on a single device may be 8 Gb or even larger. The storage space that would have to be devoted to tracking a very large number with high granularity could be quite large. As information about the reliability and remaining life of a device can be conveyed with less granular information about error counts, it may be advantageous to reduce the granularity of the metadata, or to scale it in a way that provides valuable information about the device with reduced storage requirements.

Accordingly, several embodiments of the present technology are directed to memory devices, systems including memory devices, and methods of operating memory devices in which error counts can be generated, scaled, and stored for retrieval by end users. In one embodiment, an apparatus comprises a memory array including a plurality of memory cells arranged in a plurality of columns and a plurality of rows, and circuitry configured to perform an error detection operation on the memory array to determine a raw count of detected errors, to compare the raw count of detected errors to a threshold value to determine an over-threshold amount, to scale the over-threshold amount according to a scaling algorithm to determine a scaled error count, and to store the scaled error count in a user-accessible storage location.

Figure 1:
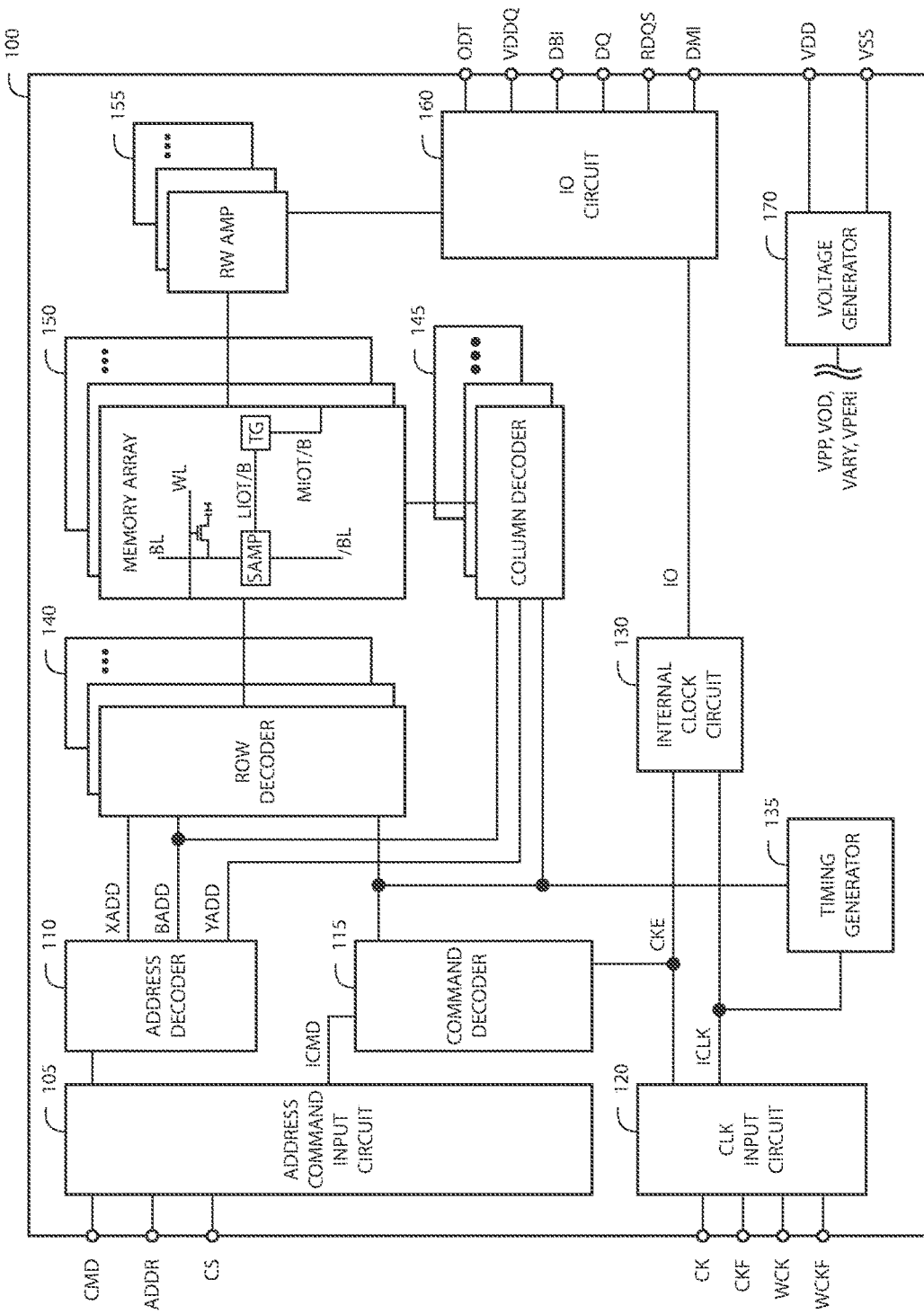
FIG. 1 is a simplified block diagram schematically illustrating a memory device in accordance with an embodiment of the present technology.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (10) clock signals. The 10 clock signals can be supplied to the input/output circuit 160 and can be used as a timing signal for determining an output timing of read data and the input timing of write data. The 10 clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

Memory devices such as the memory device 100 of FIG. 1 can be configured to track, scale, and store one or more error counts associated with error checking operations to permit end users of the device to monitor device performance. One such memory device 200 is illustrated schematically in accordance with an embodiment of the present disclosure in the simplified block diagram of FIG. 2. According to one aspect of the present disclosure, the memory device 200 can include ECC circuitry 220 to perform error check and scrub (ECS) operations on the memory array 210 to generate code word error counts, counts of rows with errors, and/or the highest number of errors detected on a single row. These counts can be scaled (e.g., into histogram 'bins' that are linearly or logarithmically scaled) with circuitry configured to implement a scaling algorithm (e.g., scaling circuitry 230), and the counts can be stored in one or more mode registers, such as mode register 240, that are user accessible.

In accordance with one embodiment of the present disclosure, one or more error counts generated by an ECS operation (e.g., a count of total code word errors, a count of the number of rows with detected error, a count of the number of errors on a single row with the highest number of errors, etc.) can be scaled linearly into one of a number of histogram bins, with the histogram bin number stored in a user-accessible location (e.g., a mode register) for reporting purposes. Table 2, below, illustrates one such example in which histogram bins of equal 64-bit size (i.e., linearly scaled bins) are used to store scaled error counts.

TABLE 2

| Raw Error Count | Scaled Count Reported |
|---|---|
| 0-63 | 0 |
| 64-127 | 1 |
| 128-191 | 2 |
| 192-255 | 3 |
| ... | ... |
| $64 \times n - 64 \times (n+1)-1$ | n |

In accordance with another embodiment of the present disclosure, the error counts generated by an ECS operation can be scaled logarithmically into one of a number of histogram bins, with the histogram bin number stored in a user-accessible location (e.g., a mode register) for reporting purposes. Table 3, below, illustrates one such example in which histogram bins of increasing size (e.g., logarithmically scaled bins, each four times larger than the previous) are used to store scaled error counts.

TABLE 3

| Raw Error Count | Scaled Count Reported |
|---|---|
| 0-3 | 0 |
| 4-15 | 1 |
| 16-63 | 2 |
| 64-255 | 3 |
| 256-1023 | 4 |
| ... | ... |
| $40^n - ((40^{n+1})-1)$ | n |

In accordance with another embodiment, the scaled histogram bins can be shifted, so that a scaled error count of 0 is reported until after an initial threshold is exceeded, after which a scaled non-zero count (e.g., linear or logarithmic) is stored in a user-accessible location. According to one aspect of the subject disclosure, the initial threshold can be programmed (e.g., by a manufacturer, a system integrator, or even an end user) by writing the threshold value to, e.g., another mode register of the memory device. Although the initial level can be set to any value, aligning the initial threshold with a multiple of 2 (e.g., 10, 12, 14, 16, etc.) or a power of 2 (e.g., 8, 16, 32, 64, etc.) allows for ease of design. Similarly, although the graduated level could be any scaling factor, a multiple of 2 (e.g., 2, 4, 6, 8, etc.) or a power of 2 (e.g., 2, 4, 8, etc.) likewise allows for ease of design. Table 4, below, illustrates one such example in which histogram bins of equal size (e.g., linearly scaled bins) are used to store scaled error counts that exceed an initial threshold level.

TABLE 4

| Raw Error Count | Scaled Count Reported |
|---|---|
| 0-127 | 0 |
| 128-143 | 1 |
| 144-159 | 2 |
| 160-175 | 3 |
| 176-191 | 4 |
| ... | ... |
| $127 + (16 \times (n-1)) - 127 + (16 \times n)$ | n |

The foregoing methods provide information regarding an increasing fail count of a memory device (e.g., potentially indicating worsening memory performance/reliability), while not proving a raw level of detail into individual memory device behavior. Memory systems can therefore be configured to determine acceptable levels of errors (e.g., based on the scaled count reported) and to take remedial action (e.g., warnings, device retirement, changing device operating parameters, etc.) based upon those errors.

Figure 3:
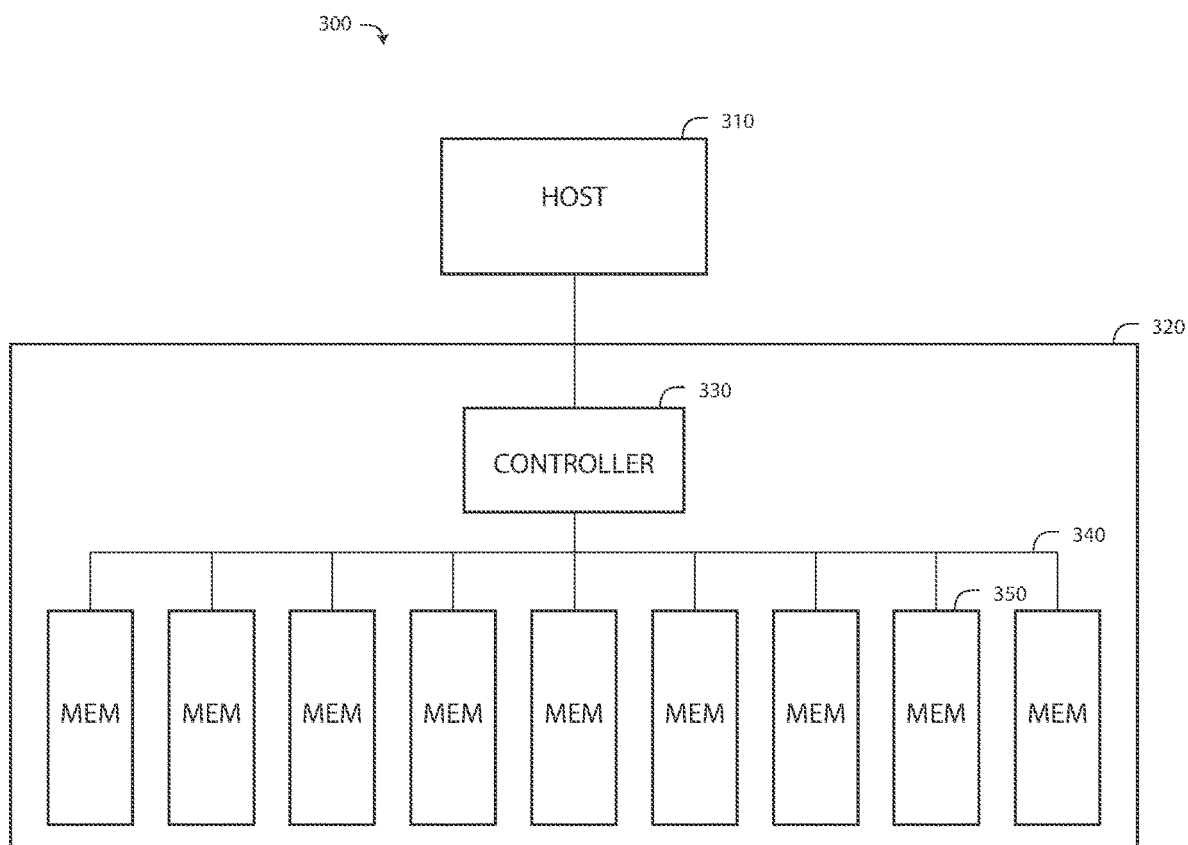
FIG. 3 is a simplified block diagram schematically illustrating a memory system in accordance with an embodiment of the present technology.

FIG. 3 is a simplified block diagram schematically illustrating a memory system 300 in accordance with an embodiment of the present technology. Memory system 300 includes a host device 310 operably coupled to a memory module 320 (e.g., a dual in-line memory module (DIMM)). Memory module 320 can include a controller 330 operably connected by a bus 340 to a plurality of memory devices 350. In accordance with one aspect of the present disclosure, each of the memory devices 350 can be configured to store one or more scaled error counts in a user-accessible location, as discussed in greater detail above, and to provide the scaled error counts in response to a request from either the controller 330 or the host device 310, received over the bus 340.

Figure 2:
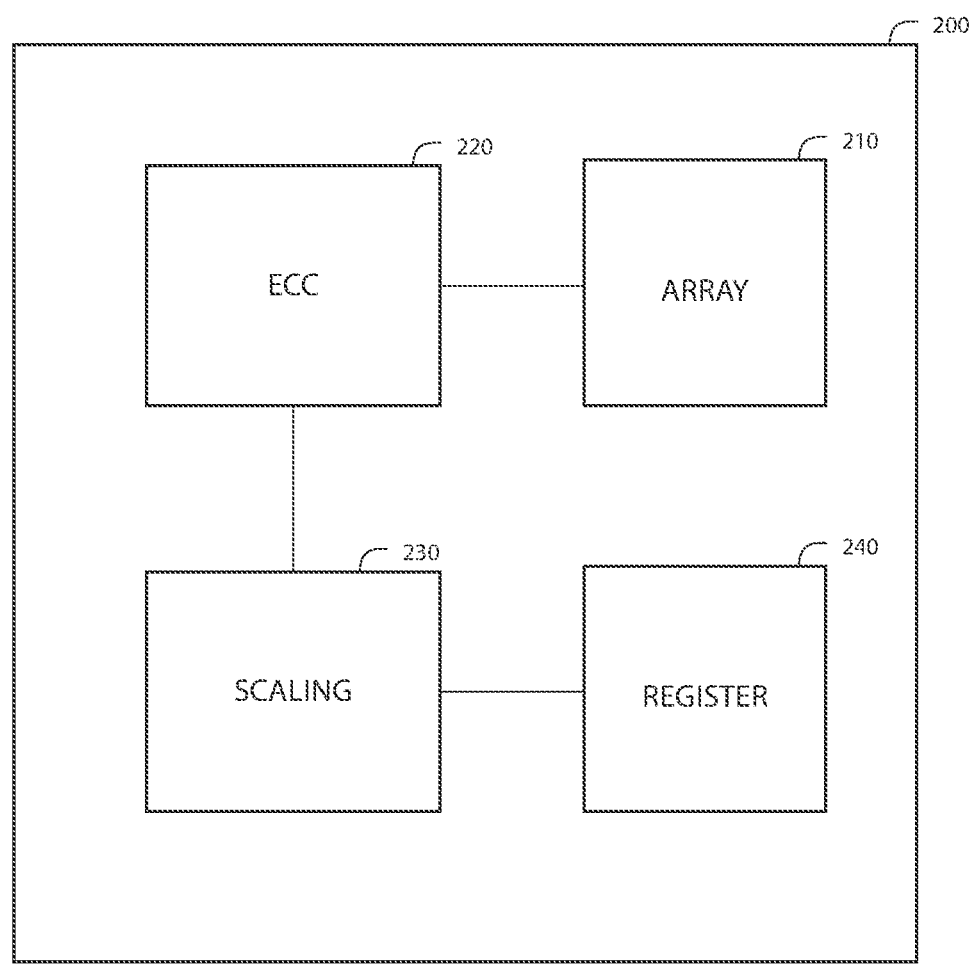
FIG. 2 is a simplified block diagram schematically illustrating a memory device in accordance with an embodiment of the present technology.

FIG. 4 is a flow chart illustrating a method of operating a memory system in accordance with an embodiment of the present technology. The method includes performing an error detection operation on a memory array to determine a raw count of detected errors (box 410). According to one aspect of the present disclosure, the error detection operation of box 410 may be performed with ECC circuitry 220, as illustrated in FIG. 2 in greater detail, above. The method further includes comparing the raw count of detected errors to a threshold value to determine an over-threshold amount (box 420). According to one aspect of the present disclosure, the comparing features of box 420 may be implemented with scaling circuitry 230, as illustrated in FIG. 2 in greater detail, above. The method further includes scaling the over-threshold amount according to a scaling algorithm to determine a scaled error count (box 430). According to one aspect of the present disclosure, the scaling features of box 430 may be implemented with scaling circuitry 230, as illustrated in FIG. 2 in greater detail, above. The method further includes storing the scaled error count in a user-accessible storage location (box 440). According to one aspect of the present disclosure, the storing features of box 440 may be implemented with mode register 240, as illustrated in FIG. 2 in greater detail, above.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An apparatus, comprising:
a memory array including a plurality of memory cells arranged in a plurality of columns and a plurality of rows; and
circuitry configured to:
perform an error detection operation on the memory array to determine a raw count of detected errors,
scale the raw count with either a with either a logarithmic scale or a linear scale to determine a logarithmically or linearly scaled error count, and
store the logarithmically or linearly scaled error count in a user-accessible storage location.

2. The apparatus of claim 1, wherein the error detection operation comprises an error check and scrub (ECS) operation that reads data from each of the plurality of rows and determines the raw count of detected errors based on a number of the plurality of rows that include at least one bit error.

3. The apparatus of claim 1, wherein the error detection operation comprises an error check and scrub (ECS) operation that reads data from each of a plurality of code words stored in the memory array and determines the raw count of detected errors based on a total number of code word errors detected during the error detection operation.

4. The apparatus of claim 1, wherein the error detection operation comprises an error check and scrub (ECS) operation that reads data from each of the plurality of rows and determines the raw count of detected errors based on one of the plurality of rows that generated a largest number of errors.

5. The apparatus of claim 1, wherein the user-accessible storage location comprises a mode register of the apparatus.

6. The apparatus of claim 1, wherein the memory array is a DRAM array.

7. A method comprising:
performing an error detection operation on a memory array to determine a raw count of detected errors;
scaling the raw count with either a with either a logarithmic scale or a linear scale to determine a logarithmically or linearly scaled error count; and storing the logarithmically or linearly scaled error count in a user-accessible storage location.

8. The method of claim 7, wherein the error detection operation comprises an error check and scrub (ECS) operation that reads data from each of a plurality of rows and determines the raw count of detected errors based on a number of the plurality of rows that include at least one bit error.

9. The method of claim 7, wherein the error detection operation comprises an error check and scrub (ECS) operation that reads data from each of a plurality of code words stored in the memory array and determines the raw count of detected errors based on a total number of code word errors detected during the error detection operation.

10. The method of claim 7, wherein the error detection operation comprises an error check and scrub (ECS) operation that reads data from each of a plurality of rows and determines the raw count of detected errors based on one of the plurality of rows that generated a largest number of errors.

11. An apparatus, comprising:
a memory array comprising a plurality of memory cells arranged in a plurality of columns and a plurality of rows; and
circuitry configured to:
perform an error detection operation on the memory array to determine a raw count of detected errors and an initial highest detected error count,
scale the raw count of detected errors with either a with either a first logarithmic scale or a first linear scale to determine a logarithmically or linearly scaled total error count,
scale the initial highest detected error count with either a with either a second logarithmic scale or a second linear scale to determine a logarithmically or linearly scaled highest error count, and
store the logarithmically or linearly scaled total error count and the logarithmically or linearly scaled highest error count in a user-accessible storage location.

12. The apparatus of claim 11, wherein the raw count of detected errors corresponds to either (i) a number of the plurality of rows that include at least one bit error, or (ii) a total number of code word errors detected during the error detection operation.

13. The apparatus of claim 11, wherein the initial highest detected error count corresponds to one of the plurality of rows that generated a largest number of errors during the error detection operation.

14. The apparatus of claim 11, wherein the circuitry is configured to scale the raw count of detected errors and to scale the initial highest detected error count with a logarithmic scale, a linear scale, or a combination thereof.

15. The apparatus of claim 11, wherein the user-accessible storage location comprises a mode register of the apparatus.

16. The apparatus of claim 11, wherein the apparatus is a DRAM device.

17. The apparatus of claim 11, wherein:
the raw count of detected errors is a first raw count of detected errors corresponding to a number of the plurality of rows that include at least one bit error,
the error detection operation further determines a second raw count of detected errors corresponding to a total number of code word errors detected during the error detection operation,
the circuitry is further configured to scale with either a with either a third logarithmic scale or a third linear scale the second raw count of detected errors to determine a second logarithmically or linearly scaled total error count and to store the second logarithmically or linearly scaled total error count in the user-accessible storage location.

* * * * *